United States Patent
Lamb

(10) Patent No.: US 12,556,163 B2
(45) Date of Patent: Feb. 17, 2026

(54) SYSTEM AND METHODS FOR ASYNCHRONOUS SIGNAL INTERPOLATION

(71) Applicant: SKYWORKS SOLUTIONS, INC., Irvine, CA (US)

(72) Inventor: David Lamb, Portland, OR (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 124 days.

(21) Appl. No.: 18/378,819

(22) Filed: Oct. 11, 2023

(65) Prior Publication Data

US 2024/0128951 A1    Apr. 18, 2024

Related U.S. Application Data

(60) Provisional application No. 63/379,538, filed on Oct. 14, 2022.

(51) Int. Cl.
| | | |
|---|---|---|
| *H03H 7/30* | (2006.01) | |
| *H03H 7/40* | (2006.01) | |
| *H03H 17/02* | (2006.01) | |
| *H03K 5/159* | (2006.01) | |

(52) U.S. Cl.
CPC .................................. *H03H 17/02* (2013.01)

(58) Field of Classification Search
CPC ........................... H03H 17/02; H03H 17/0628
USPC .................... 375/371, 372, 229, 350, 351
See application file for complete search history.

(56) References Cited

U.S. PATENT DOCUMENTS

| | | | |
|---|---|---|---|
| 5,471,411 A | * | 11/1995 | Adams ............... H03H 17/0628 708/313 |
| 5,475,628 A | | 12/1995 | Adams et al. |
| 8,849,883 B2 | | 9/2014 | Pan et al. |

FOREIGN PATENT DOCUMENTS

WO        2017134097 A1    8/2017

OTHER PUBLICATIONS

Adams et al., "Theory and VLSI Architectures for Asynchronous Sample-Rate Converters," J. Audio Eng. Soc., vol. 41, No. 7/8, pp. 539-555, Jul. 1993.
Adams, "Asynchronous Sample-rate Converters," Analog Dialogue 28-1 (1994), pp. 9-11.
Analog Devices, "Programming Asynchronous Sample Rate Converters on ADSP-2136x SHARC® Processors", Engineer-to-Engineer Note, EE-268 (2005), 8 pages.

(Continued)

*Primary Examiner* — Phuong Phu
(74) *Attorney, Agent, or Firm* — Lando & Anastasi, LLP

(57) ABSTRACT

Aspects of this disclosure relate to an asynchronous sample rate converter (ASRC) comprising a signal input configured to receive an input signal having one or more input signal values at a first sample rate, a first clock input configured to receive an input clock signal corresponding to the first sample rate, a signal output configured to provide an output signal having one or more output signal values at a second sample rate, a second clock input configured to receive an output clock signal corresponding to the second sample rate, a zero-padding circuit configured to add a plurality of zero values following at least one of the one or more input signal values, and a filter configured to generate the output signal, the output signal having one or more output signal values based on the input signal.

19 Claims, 7 Drawing Sheets

(56) References Cited

OTHER PUBLICATIONS

Analog Devices, AD1896 Datasheet and Product Information <<https://www.analog.com/en/products/ad1896.html>>, retrieved from the Internet on Jun. 23, 2022.

Babic et al., "Implementation of the transposed Farrow structure," 2002 IEEE International Symposium on Circuits and Systems. Proceedings (Cat. No. 02CH37353), 2002, pp. IV-5-IV-8.

Farrow, "A continuously variable digital delay element," Proc. IEEE ISCAS'88, pp. 2641-2645, Jun. 1988.

Hentschel et al., "Continuous-Time Digital Filters for Sample-Rate Conversion in Reconfigurable Radio Terminals," Frequenz, vol. 55, 2001, pp. 185-188.

Hentschel, "Sample Rate Conversion in Software Configurable Radios", 2002, ISBN-13: 978-1580533362.

* cited by examiner

SYSTEM AND METHODS FOR ASYNCHRONOUS SIGNAL INTERPOLATION

CROSS-REFERENCE TO RELATED APPLICATIONS

This application claims priority under 35 U.S.C. § 119(e) to U.S. Provisional Patent Application Ser. No. 63/379,538, titled "SYSTEM AND METHODS FOR ASYNCHRONOUS SIGNAL INTERPOLATION," filed Oct. 14, 2022, the entire content of which is incorporated herein by reference in its entirety for all purposes.

BACKGROUND

At least one example in accordance with the present disclosure relates generally to asynchronous sample rate conversion between two devices using asynchronous sample rate converters (ASRCs). ASRCs are devices that receive a signal at a first frequency and convert the signal to a second frequency.

SUMMARY

According to at least one aspect of the present disclosure an asynchronous sample rate converter (ASRC) is presented. The ASRC may comprise a signal input configured to receive an input signal having one or more input signal values at a first sample rate a first clock input configured to receive an input clock signal corresponding to the first sample rate a signal output configured to provide an output signal having one or more output signal values at a second sample rate a second clock input configured to receive an output clock signal corresponding to the second sample rate a zero-padding circuit configured to add a plurality of zero values following at least one of the one or more input signal values and a filter configured to generate the output signal, the output signal having one or more output signal values based on the input signal.

In some examples, the filter is a transposed farrow filter. In various examples, at least one of the first sample rate and second sample rate are variable rather than constant. In many examples, the filter has a polynomial order. In various examples, the output signal values of the output signal are based on the polynomial order of the filter. In many examples, the output signal includes a number of non-zero output signal values, the number of non-zero output signal values being based on the number of non-zero input signal values and the polynomial order of the filter. In some examples, the ASRC further comprises a decimating filter, the decimating filter being configured to receive the output signal and preserve one or more of the output signal values based on the second sample frequency, removing any output signal values not preserved.

In many examples, the filter includes at least two of the elements of a set comprising adders, zero-order holds, and multipliers. In some examples, the zero-padding circuit is configured to virtually add the plurality of zeroes to the input signal, such that the input signal is not actually altered. In various examples, the ASRC has a first mode corresponding to the first sample frequency being greater than the second sample frequency, and a second mode corresponding to the second sample frequency being greater than the first sample frequency, wherein in the first mode the zero-padding circuit is configured to add the plurality of zero values following at least one of the one or more input signal values, and in the second mode the zero-padding circuit is configured to not add the plurality of zero values, and the filter is configured to interpolate the output signal. In some examples, the filter includes a first section and a second section, the first section being an integrator and the second section being configured to operate as a transposed polynomial filter and a polynomial filter.

At least one aspect of this disclosure relates to an asynchronous sample rate converter (ASRC) comprising a master clock input, a phase-locked loop circuit coupled to the master clock input, a transposed polynomial filter, a zero padding circuit coupled to the transposed polynomial filter, a digital signal input coupled to the zero padding circuit, a digital signal frequency input coupled to the phase-locked loop circuit, a simple signal frequency input coupled to the phase-locked loop circuit, a sampled signal output coupled to the transposed polynomial filter, and a controller.

At least one aspect of this disclosure relates to a method to convert an input signal from a first sample rate to a second sample rate. The method may comprise receiving the input signal at the first sample rate, the input signal having one or more input signal values, receiving a second sample rate, adding a plurality of zero values following each input signal value of the one or more input signal values, producing a zero-padded signal based on the input signal by converting each non-zero input signal value of the one or more input signal values to a plurality of non-zero input signal values and replacing one or more of input signal values and the plurality of zero values added following the one or more input signal values with one or more of the plurality of non-zero input signal values, and producing an output signal by selecting at least one of one or more signal values of the zero-padded signal, the selection of the at least one of the one or more signal values of the zero-padded signal being based on the second sample rate.

In various examples the plurality of non-zero input signal values has a number of elements based on a polynomial order of a polynomial filter. In many examples, at least one of the first sample rate and second sample rate is variable rather than constant. In some examples, adding the plurality of zero values is a virtual operation, such that the input signal is not altered before the zero-padded signal is produced. In various examples, producing the output signal is done by providing the output signal to a fixed decimator.

At least one aspect of this disclosure relates to a method to convert a signal between asynchronous sample rates, the method comprising receiving an input signal at a first frequency, receiving a sample frequency, providing the input signal to a zero padding circuit configured to pad the input signal with zeroes to form a zero padded input signal, providing the zero padded input signal to a transposed polynomial filter configured to alter the zero padded input signal to produce an altered input signal having each non-zero element of the zero padded input signal transformed into a respective number of non-zero elements of the altered input signal, the respective number of non-zero elements of the altered input signal being equal to the order of the transposed polynomial filter, providing the altered input signal to a decimator configured to decimate the altered input signal to produce a decimated altered input signal, sampling the decimated altered input signal at the sample frequency, and providing samples of the decimated altered input signal to an output.

In some examples, providing the input signal to the zero padding circuit to pad the input signal with zeroes to form a zero padded input signal is a virtual operation that does not alter the input signal. In some examples, the first frequency and sample frequency are variable with respect to time. In some examples, providing the input signal to the zero padding circuit includes sampling the input signal at a sample rate greater than the first frequency. In some examples, providing samples of the decimated altered input signal to an output includes a receiver circuit sampling the decimated altered input signal at a sample rate greater than a frequency of the decimated altered input signal.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION

Figure 1:
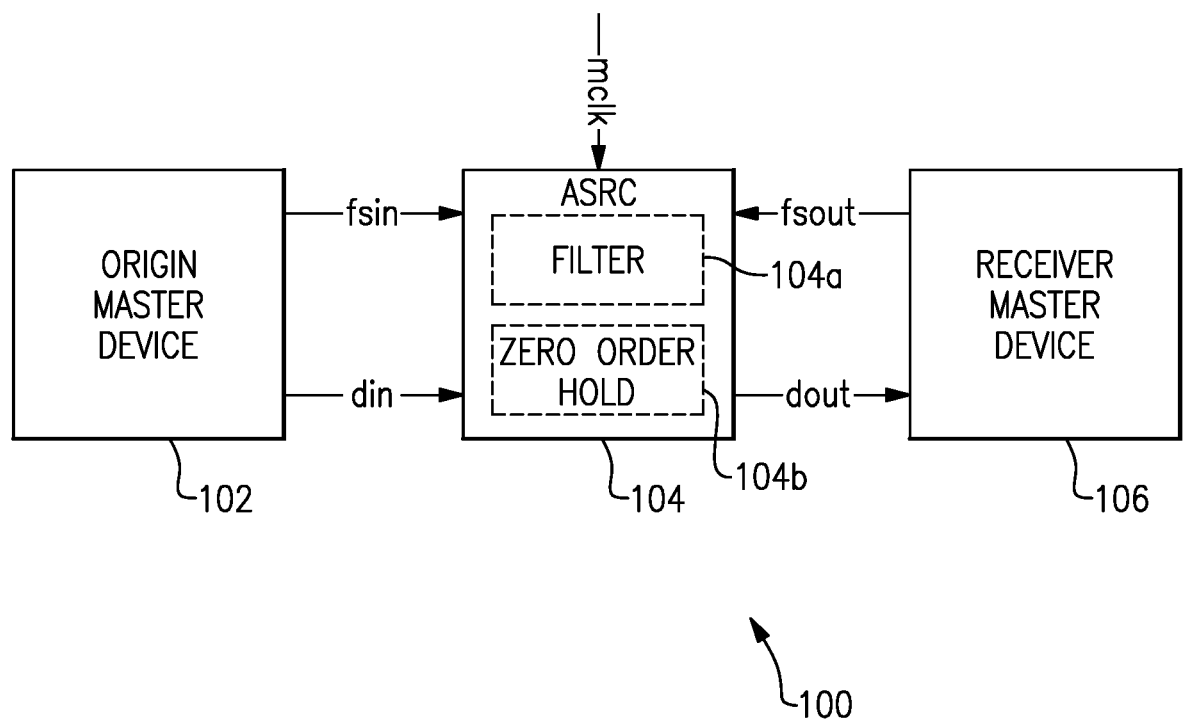
FIG. 1 illustrates a block diagram of a digital ASRC system according to an example.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items.

References to "or" may be construed as inclusive so that any terms described using "or" may indicate any of a single, more than one, and all of the described terms. In addition, in the event of inconsistent usages of terms between this document and documents incorporated herein by reference, the term usage in the incorporated features is supplementary to that of this document; for irreconcilable differences, the term usage in this document controls.

Asynchronous sample rate converters (ASRCs) may be implemented to convert data from one clock source at a particular sample rate to another clock source at a different sample rate. However, the problem of converting digital signals at asynchronous sample rates between two devices, a first device and a second device, poses substantial difficulties. Some solutions utilize a digital-to-analog converter (DAC) to convert the initial digital signal into an analog signal. Once a signal is converted to an analog form, it exists in continuous form in the time domain (rather than a discrete form), and may be sampled by the second device and processed into a digital signal again using an analog-to-digital converter (ADC). In some examples, a filter, such as a brick wall filter, may be used to filter the analog signal as it is transmitted from one digital device through the DAC to the other device (via the ADC).

In some examples, digital-to-digital ASRCs are possible. Digital-to-digital ASRCs may replace the analog conversion step with a digital interpolation filter with a high output sample rate and a zero-order hold (ZOH). In some examples, the digital interpolation filter may include a zero-padding block and a filter, such as a low pass filter.

However, as will be discussed below, such digital-to-digital ASRCs require a substantial amount of circuitry, and use large amounts of memory, such that their implementation is impractical in applications having stringent size requirements.

Turning to the figures, FIG. 1 illustrates a block diagram of a digital ASRC system 100 according to an example. ASRC system 100 includes an origin master device (OMD) 102, an ASRC 104, and a receiver master device (RMD) 106. The OMD 102 provides a digital input signal (din) to the ASRC 104. The OMD 102 also provides a clock signal (fsin), to the ASRC 104. The clock signal, fsin, corresponds to the sample rate of the OMD 102. The RMD 106 receives a digital output signal (dout) from the ASRC 104, and provides a clock signal (fsout) to the ASRC 104. The clock signal, fsout, corresponds to the sample rate of the RMD 106. A master clock signal (mclk) may also be provided to the ASRC 104.

Figure 2:
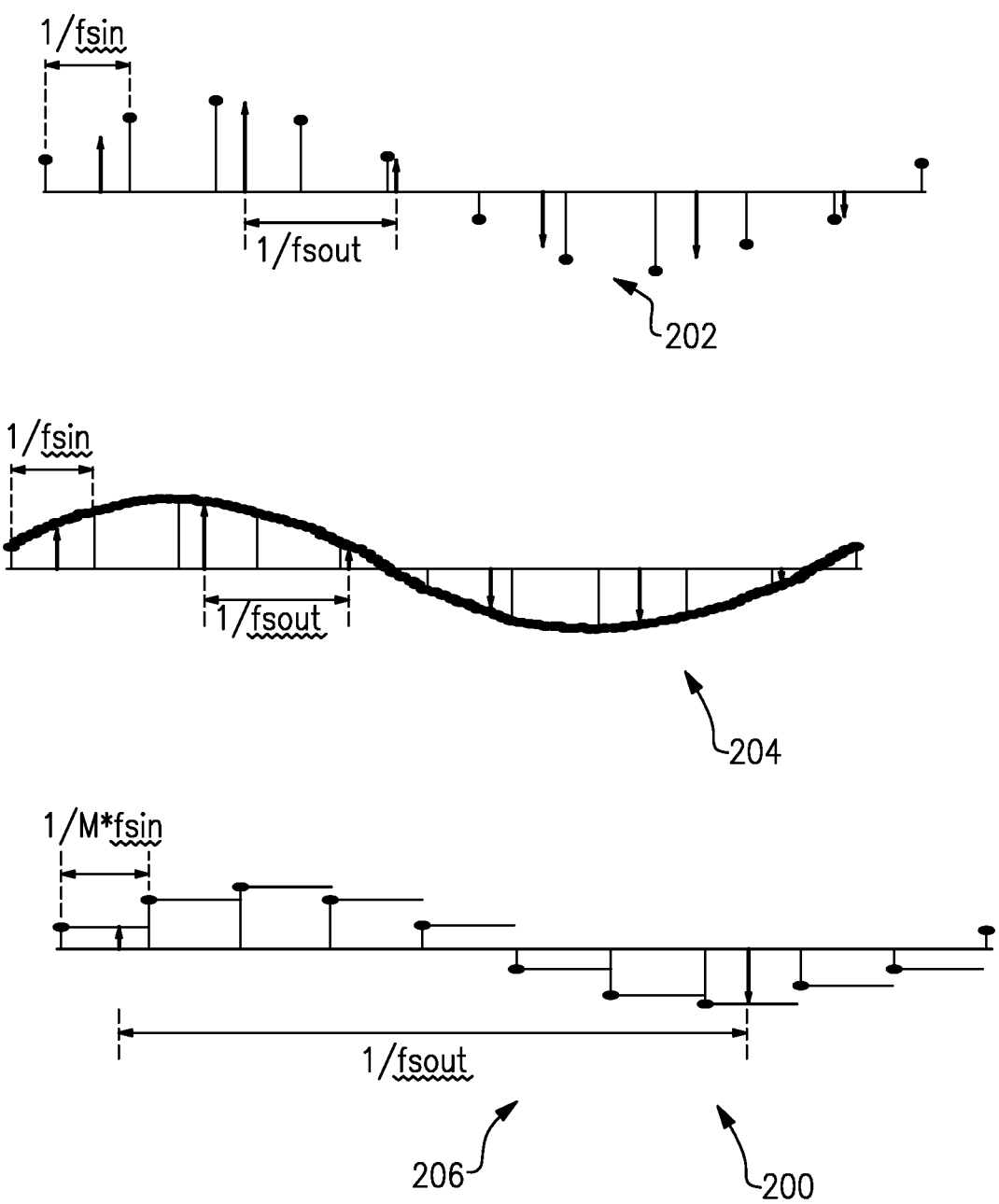
FIG. 2 illustrates an asynchronous sample rate conversion process according to various examples.

The ASRC 104 may include a zero-order hold circuit (ZOH circuit) 104b and/or a filter 104a, for example a low-pass filter or any other type of filter. The initial input signal, din, has discrete elements occurring at intervals of 1/fsin. The output signal, dout, has been converted from the fsin sample rate to the fsout sample rate, and has discrete elements occurring at intervals of 1/fsout. FIG. 2 describes the sampling-resampling process of converting din to dout in greater detail.

It will be appreciated that fsin and fsout need not be constant values. That is, fsin and fsout may, and generally do, vary with time. The ASRC system 100 may include tracking circuitry that calculates and tracks the ratio of fsin/fsout (and/or fsout/fsin). The tracking circuitry may, in some examples, include a digital phase-locked loop circuit. In some examples, the tracking circuitry may be incorporated into the ASRC 104.

Turning to FIG. 2, FIG. 2 illustrates an asynchronous sample rate conversion process 200 according to various examples. FIG. 2 will be discussed with respect to the aspects and elements of FIG. 1 for the purposes of clarity.

Graph 202 shows the input signal, din, with a period of 1/fsin. In graph 202 no interpolation has been carried out. Each discrete element of din is represented by a line terminated by a circle. Graph 202 further shows the ASRC 104 attempting to sample din at a sample rate of fsout, with a period of 1/fsout. Each time the ASRC 104 attempts to sample din is represented by a line terminating in an arrow. As can be seen in graph 202, without interpolation the ASRC 104 is generally unable to sample din, since it is unlikely that an attempt to sample din will coincide in time with an output from din. Accordingly, some sort of interpolation of din is necessary to reliably sample din at a sample rate of fsout.

Graphs 204 and 206 are similar to graph 202, but include interpolation of din.

In graph 204, continuous interpolation is carried out, such that virtually every point between each discrete element of din is accounted for. When the ASRC 104 samples the signal at a sample rate of fsout, the ASRC 104 obtains an interpolated value and can record that value to produce dout. Graph 206 shows another interpolation method, known as sample-and-hold (SH) where the ASRC 104 holds din constant until the ASRC 104 receives a new discrete element of din. That is, din is constant over an interval of 1/fsin based around the discrete inputs of din. The period of din (i.e., 1/fsin) may be manipulated by the ZOH circuit, such that the period becomes $$\frac{1}{M \cdot f\text{sin}}.$$

Examples where the period of din is $$\frac{1}{M \cdot f\text{sin}}$$

may correspond to the ASRC 102 oversampling din at a frequency of (M·f sin). Oversampling of din may be performed by an oversampling filter.

However, interpolating as described above with respect to graphs 204, 206 can, in some examples, impose substantial disadvantages on the ASRC 104. By way of example, suppose that the ASRC system 100 is being used to convert an audio signal within an audio frequency range of 8 kHz to 192 kHz (though any range of frequencies may be used). Further suppose that it is desired to interpolate sufficiently to get a 120 dB filter. Interpolating the input signal in this manner could require that the ASRC 104 perform up to approximately $2^{19}$ interpolations and/or calculations. For example, a 38 kHz sample rate (i.e., fsout) implies interpolating the input signal at 25 GHz to get the desired 120 dB performance. The ASRC 104 may therefore require a filter 104a with approximately 33 million tap coefficients. The 33 million tap coefficients will need to be stored in some form of memory (for example, read only memory (ROM)), and additional memory may be required for performing calculations (for example, random access memory (RAM)).

However, in some examples, it is not necessary to perform every interpolation. That is, in some examples, the ASRC 104 may interpolate only a subset of values when it receives a sample request from the RMD 106. The ASRC 104 may use a polyphase implementation such that each interpolated output consists of a known subset of the 33 million tap coefficients. In such an implementation, only 64 taps may be required per phase, which corresponds to using a 64-tap filter for each output request. Accordingly, the ASRC 104 may only need to calculate the interpolation when a sample request, such as the sample requests of the ASRC 104, is received at the sample rate fsout. Interpolating only when sample requests are received allows the circuit to use a smaller filter, for example the 64-tap filter mentioned above. However, because the circuit does not necessarily know when the sample requests will be received, the circuit may have to store all approximately 33 million tap coefficients. It should be appreciated that 33 million coefficients may be impractical to store for many applications. Accordingly, a subset of the coefficients may be stored instead, and the remaining coefficients calculated as necessary. To save space, various methods may be used, for example a cubic spline fit based on the coefficients (which may be contained in a look-up table (LUT)).

Despite the improvements over the 33 million coefficient model, using a subset of coefficients and calculating the remaining coefficients still requires a large amount of memory (e.g., ROM) to store the coefficients, and a large amount of memory (e.g., RAM) for input data storage. However, the memory requirements (ROM, RAM, and so forth) may be reduced using methods discussed with respect to FIGS. 4-6, below.

Figure 3:
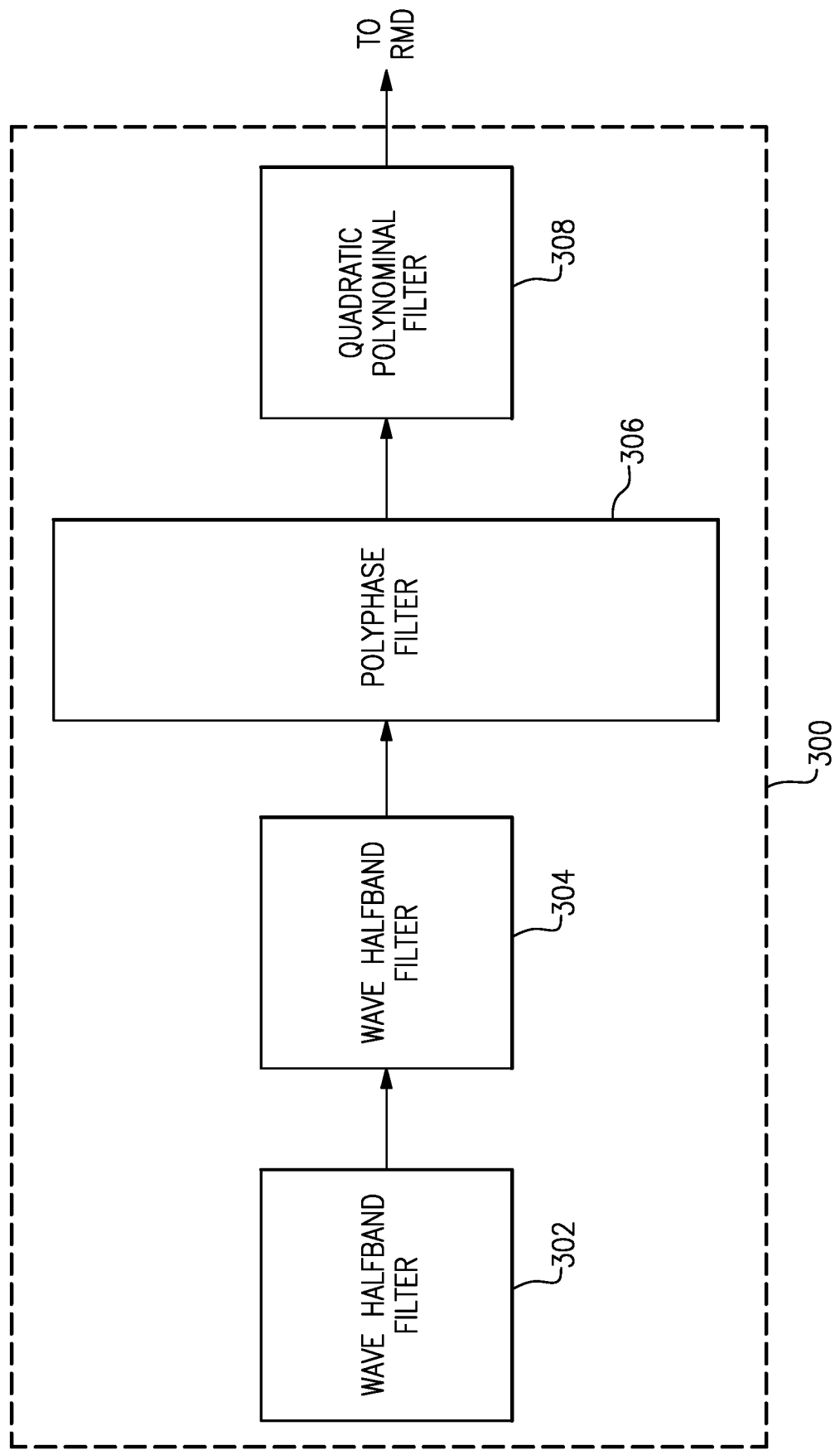
FIG. 3 illustrates a block diagram ASRC according to an example.

FIG. 3 illustrates an ASRC 300 according to an example using the methods described with respect to FIG. 2. ASRC 300 includes a first wave halfband filter 302 and a second wave halfband filter 304. The first and second wave halfband filters 302, 304 may be substantially identical. The ASRC 300 further includes a polyphase filter 306 and a quadratic polynomial filter 308.

The first wave halfband filter 302 receives an input signal, for example din, and increases the number of elements in the input signal by two times. That is, the first wave halfband filter 302 doubles the number of elements in din, and provides the doubled signal to the second wave halfband filter 304. The second wave halfband filter 304 again doubles the number of elements in the signal, for a total increase of four times the number of elements of the original input signal, and provides the now quadrupled input signal to the polyphase filter. The polyphase filter 306 increases the number of elements in the input signal by an additional 16 times, for a total increase of 64 times the number of elements of the original input signal. The polyphase filter 306 then provides the "up 64" signal to the quadratic polynomial filter 308, which samples the signal at fsout and provides the resampled signal to the RMD 106. The polyphase filter 306 need only calculate a subset of the total 16 possible phases based on the order of the polyphase filter 306. That is, a second order polyphase filter 306 would need only calculate three phases of the input signal, rather than 16.

However, those skilled in the art will appreciate that the above approach may cause aliasing when fsout<fsin. Aliasing caused by this approach may be corrected with methods known in the art, for example the 1896 sample rate converter from Analog Devices of Wilmington MA. However, known solutions are disadvantageous because they require performing work twice. For example, in FIG. 3, the ASRC 300 can increase the input signal by 64 times ("up 64"), but must later decimate it by N times, where N corresponds to fsout. Alternatively, the input signal could instead be bandwidth limited, but bandwidth limiting filters are costly.

A transposed farrow filter (as will be discussed with respect to FIG. 4A) provides another potential solution. However, the transposed farrow filter requires that the ASRC 300 interpolate the input signal first because the data used by the transposed farrow filter must already be oversampled. However, oversampling in this manner yields a poor frequency response and requires that the ASRC 300 perform the work twice (i.e., oversample and then decimate).

It will be appreciated that the structures of halfband wave filters are well-known in the art and may be optimized to suit particular applications, such as interpolation in ASRCs.

Figure 5A:
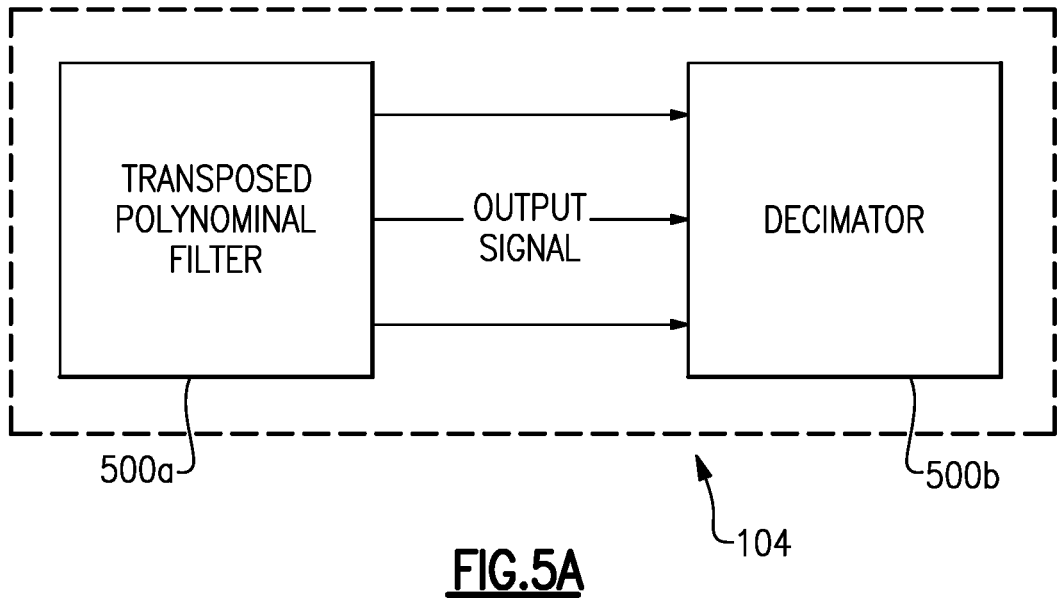
FIG. 5A illustrates a block diagram of an ASRC according to an example.
Figure 5B:
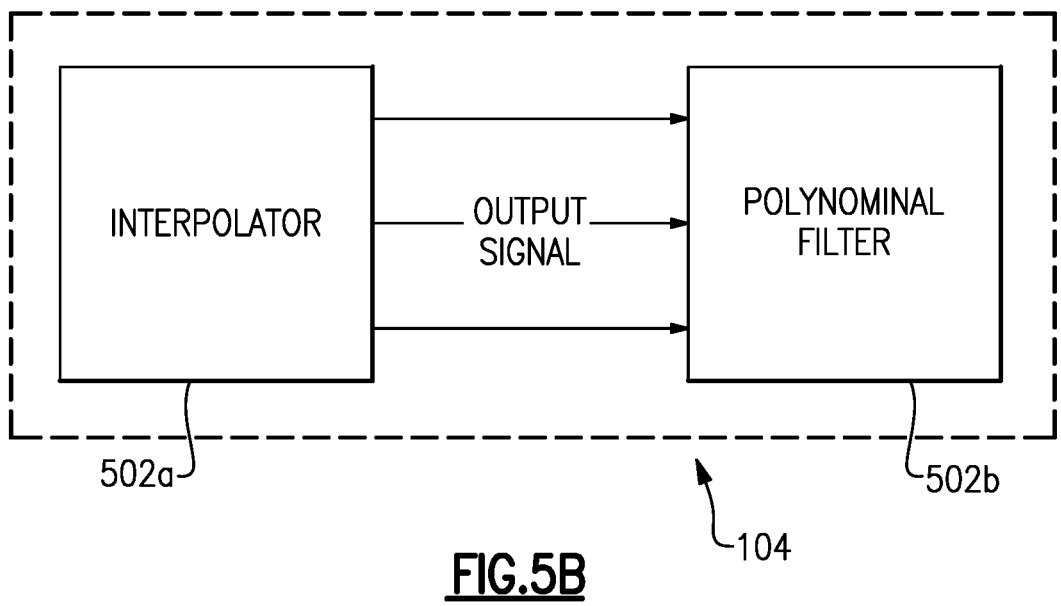
FIG. 5B illustrates a block diagram of an ASRC according to an example.
Figure 6:
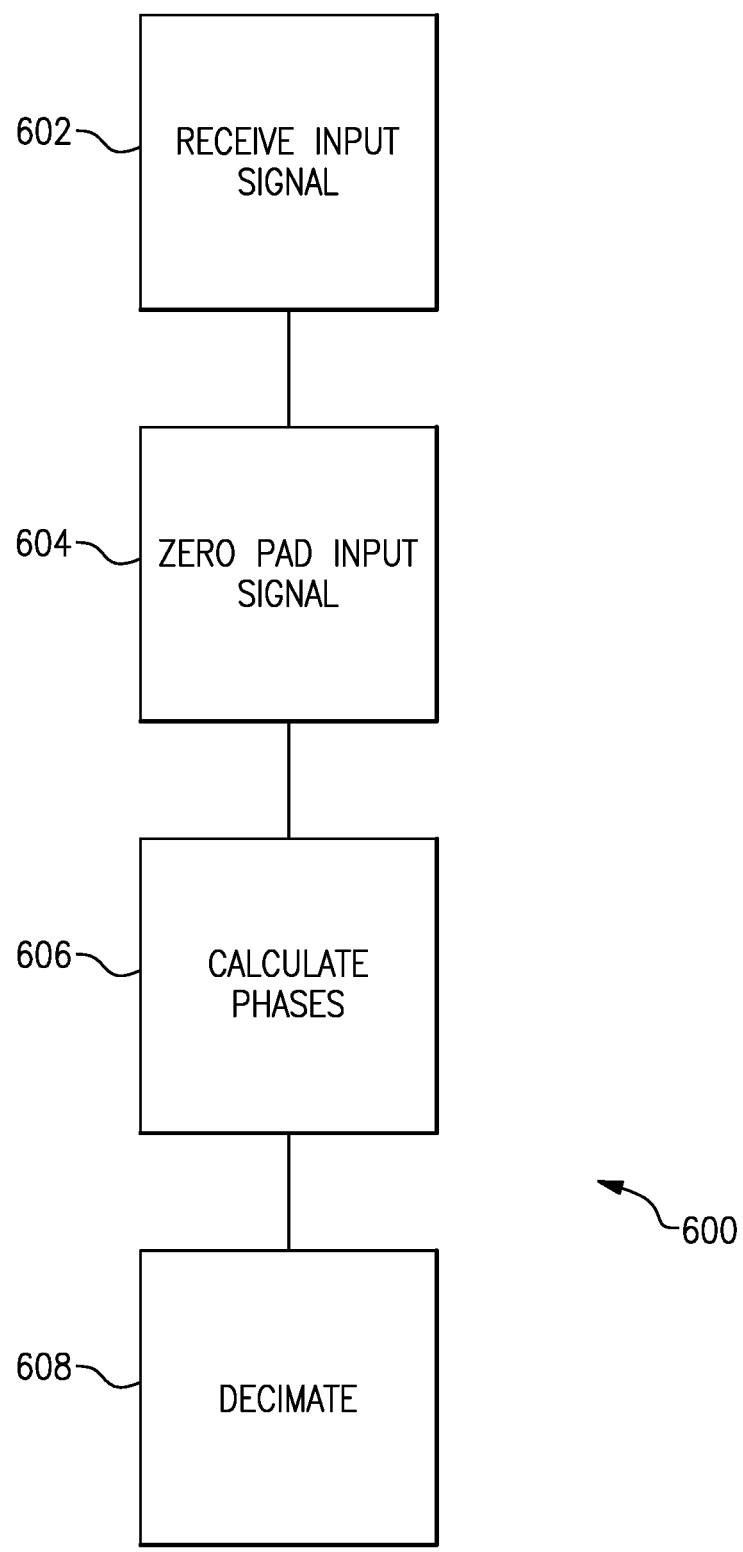
FIG. 6 illustrates a flowchart of a zero padding process according to an example.

A novel solution to the above problems is now discussed with respect to FIGS. 4-6. In brief, no interpolation is required at all to convert din from a sample rate of fsin to dout at a sample rate of fsout. Instead, a zero padded input signal may be passed through a decimator, requiring no additional work, and allowing engineers and other designers to used fixed filter topologies that are well-known and understood, and which may be optimized aggressively. This represents a leap forward in the art.

Figure 4A:
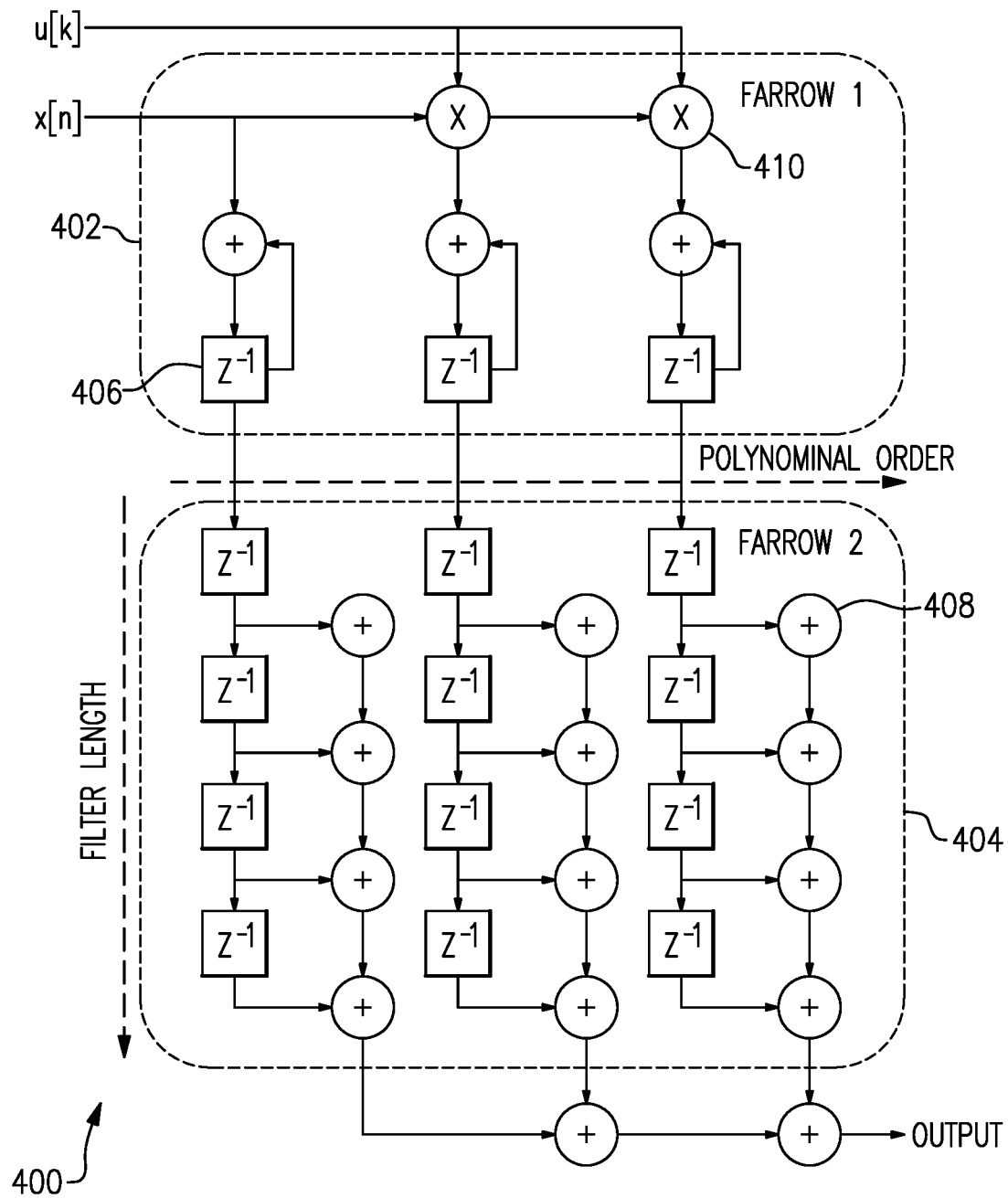
FIG. 4A illustrates a block diagram of a transposed farrow filter according to an example.

Turning now to FIG. 4A, FIG. 4A illustrates a transposed farrow filter 400 according to an example. The transposed farrow filter 400 may be incorporated into the ASRC 104, for example as part of the filter 104a or the ZOH circuit 104b. The transposed farrow filter 400 includes an integration portion 402 (labeled Farrow 1), and an output portion 404 (labeled Farrow 2). Within both integration and output portions 402, 404 are sample and hold blocks (SH blocks) 406, adders 408, and multipliers 410. The output portion 404 is further connected to two adders 408. The transposed farrow filter 400 has a filter length based on the number of rows of the output portion 404. In FIG. 4A there are four rows corresponding to the four rows of SH blocks 406, and thus the filter length may be four, though other lengths are possible. The transposed farrow filter has a polynomial order based on the number of columns of the output portion 404. In FIG. 4A there are three columns and thus the transposed farrow filter 400 has an order of two (the order may equal the number of columns minus one), though other orders are possible. It will be appreciated that the farrow filter 400 may have fewer or more rows and columns, and the number of rows and columns may be equal or different. The transposed farrow filter 400 has inputs u[k] and x[n], which may be digital signals. The signal x[n] may be a zero-padded input signal, for example zero-padded din.

Figure 4B:
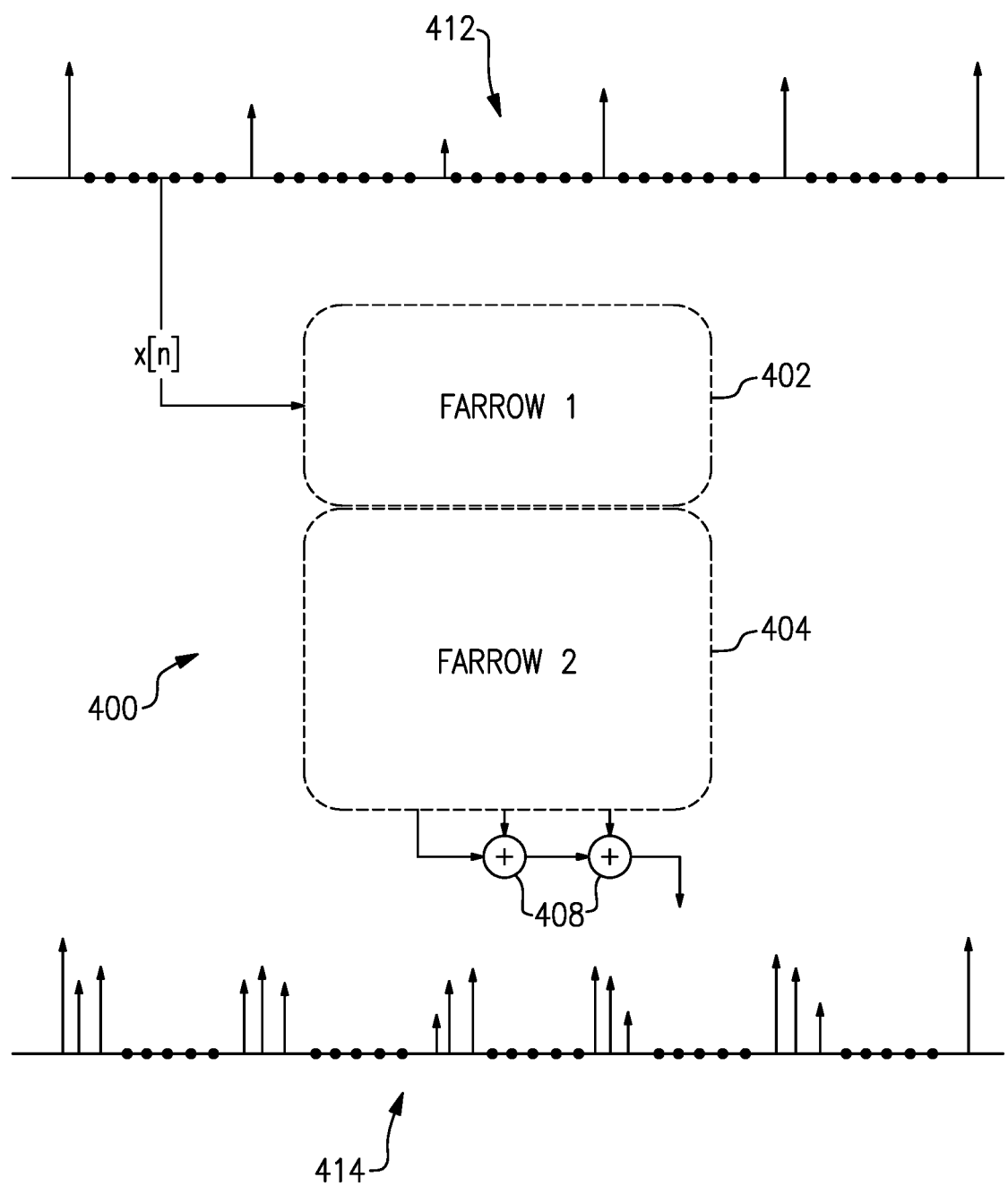
FIG. 4B illustrates a block diagram and the functionality of a transposed farrow filter according to an example.

FIG. 4B illustrates the functionality of the transposed farrow filter 400 according to an example. The transposed farrow filter 400 receives a zero padded input signal (x[n]) 412. The transposed farrow filter 400 filters the zero padded input signal 412 and produces the output signal 414. It will be appreciated that not all of zero padded input signal 412 or output signal 414 are shown in FIG. 4B.

The output signal 414 depends on the sample rate fsout, while the input signal, for example din, depends on the sample rate fsin. The input signal is padded with zeroes. Zero padding means that the input signal receives additional discrete elements such that the number of discrete elements of the input signal equals (M·f sin), where M is an integer. In some examples, this means that any input signal input to the transposed farrow filter 400 is transformed from a single element into a single element followed by M−1 zero-elements, the zero-elements having a value of zero. For example, for an input signal of {1, 1, 1}, and for M equal to three, the zero-padded input signal 412 may be {1, 0, 0, 1, 0, 0, 1, 0, 0}. The value of M is chosen such that (M·f sin) is greater than (N·fsout), where N is also an integer and equals the order of the transposed farrow filter 400. The ASRC 104 may perform the zero padding itself as it receives the input signal (for example, din), or the input signal may be zero padded before it is provided to the ASRC 104.

Zero padding the input signal may not require any work (meaning that computational time and energy requirements may be minimal or zero). Zero padding may be a "virtual" operation: rather than actually increasing the number of discrete elements of the input signal input into the transposed farrow filter 400, the ASRC 104 may be designed such that the transposed farrow filter 400 treats the input signal as though it has been zero-padded, even though the input signal has not been altered.

The transposed farrow filter 400 will transform any non-zero element of the zero padded input signal 412 into N non-zero elements of the output signal 414, where N equals the order of the transposed farrow filter 400. In some examples, the original input values of the zero padded input signal 412 will be preserved, meaning the value of the non-zero discrete elements of the input signal 412 will occur in the same or roughly the same place in the output signal 414 as they occurred in the zero padded input signal 412. In other examples, the original values of the input signal 412 are not preserved. As an example of the operation of the transposed farrow filter 400, if the order of the transposed farrow filter 400 is two, then for each non-zero element of the input signal 412 there will be two non-zero elements of the output signal 414. Continuing with the example where the zero padded input signal 412 is {1, 0, 0, 1, 0, 0, 1, 0, 0}, and given N equals two, the output signal 414 may be {4, 1, 0, 1, 3, 0, 2, 2, 0}, where for each non-zero element of the zero padded input signal 412 there are now two non-zero elements of the output signal 414. The output signal 414 need not have an identical number of discrete elements as the zero padded input signal 412, and additional zeroes or non-zero values may be added or removed from the output signal 414 relative to the zero padded input signal 412 depending on the values of fsin and fsout.

Furthermore, the integration portion 402 of the transposed farrow filter 400 need not be included in the transposed farrow filter 400 because the input signal has already been zero padded, which means that the ASRC 104 only needs to decimate the signal, and does not need to perform any interpolation. It will also be appreciated by those skilled in the art that the input signal, din, is not being oversampled using this method. It will be further appreciated that, in effect, the method described above directly converts the sample rate from fsin to N·fsout.

FIGS. 5A and 5B illustrate block diagrams of the ASRC 104 according to examples. FIG. 5A illustrates a first mode of operation, and FIG. 5B illustrates a second mode of operation.

In FIG. 5A, the ASRC 104 is in a first mode of operation. In the first mode of operation, fsin is greater than fsout. In the first mode of operation, the transposed polynomial filter 500a may be an example of the transposed farrow filter 400 described in FIGS. 4A and 4B. The transposed polynomial filter 500a receives an input signal and produces an output signal having N non-zero elements for every non-zero element of the input signal. The output signal is provided by the transposed polynomial filter 500a to the decimator 500b. The decimator 500b decimates the output signal by a factor of M. In this context, the decimator 500b is downsampling the output signal of the transposed polynomial filter 500a, in some examples, by reducing the number of elements of the output signal by a factor of M. For example, if the output signal contains 7680 elements, and M equals 64, then the decimator reduces the output signal to 120 elements (i.e., 7680 divided by 64). The ASRC 104 then provides the decimated signal, produced by the decimator 500b decimating the output signal, to the RMD 106. The RMD 106 samples the decimated signal at a rate of fsout. The transposed polynomial filter 500a may be a transposed farrow filter 400 discussed with respect to FIGS. 4A and 4B.

The decimator 500b may be fixed, meaning that M may be a set value, for example 2, 4, 64, and so forth. It will be appreciated by those skilled in the art that fixed decimators may be optimized for particular functions and purposes.

In FIG. 5B, the ASRC 104 is in a second mode of operation. In the second mode of operation, fsin is less than fsout. The ASRC 104 therefore interpolates the input signal using the interpolator 502a to produce a sufficiently oversampled signal, the output signal, and then provides the output signal to a polynomial filter 502b. The polynomial filter 502b provides the filtered signal produced by filtering the output signal of the interpolator 502a to the RMD 106. The RMD 106 samples the filtered signal at a rate of fsout.

In FIG. 5B, the interpolator 500a may be implemented as a digital ASRC 104 implementing an interpolation operation as described with respect to FIG. 2. Furthermore, the polynomial filter 502b may be a transposed farrow filter, such as transposed farrow filter 400, as discussed with respect to FIGS. 4A and 4B. When a transposed farrow filter 400 is used, the transposed farrow filter 400 may be used as the interpolator 502a by simply altering the commands given to it by, for example, a controller or control circuit. That is, no physical changes to the transposed farrow filter 400 are required to allow it to act as an interpolator. Thus, it will be appreciated, the ASRC 104 may use the hardware described in FIG. 5A to perform the functions described in FIG. 5B.

It will be appreciated that the ASRC 104 may switch between operation modes based on fsin and fsout. For example, when fsin is less than fsout, the ASRC 104 may switch to the second mode of operation. When fsin is greater than fsout, the ASRC 104 may switch to the first mode of operation.

FIG. 6 illustrates a flowchart of a zero padding process 600. At act 602, the ASRC 104 receives an input signal from the OMD 102, the input signal having a rate of fsin. The process 600 then proceeds to act 604. At act 604, the ASRC 104 zero pads the input signal to produce a zero padded input signal. The zero padded input signal may be virtually zero padded (i.e., the ASRC 104 may treat the input signal as though it is zero padded, even without actually altering the input signal), or the input signal may be actually manipulated to include additional zero elements, for example as described with respect to FIGS. 4A and 4B. The process 600 then proceeds to act 606.

At act 606, the ASRC 104 calculates non-zero output values, the number of non-zero output values being based on the order of the polynomial filter (for example, transposed farrow filter) within the ASRC 104. The ASRC 104 then provides a new signal having the new non-zero output values. The process 600 then proceeds to act 608. At act 608, the ASRC 104 decimates (or downsamples) the new signal to produce an output signal having a rate of fsout for the RMD 106.

Through use of the techniques described above, for example zero-padding and decimation via the transposed farrow filter, it is possible to substantially reduce the amount of space, power, and memory required by the design. For example, in a mode using 64 taps, it is possible to reduce the number of computations by more than a factor of 5 (for example, 5.3 or 6.6, and so forth). For example, multiply-accumulate operations (MAC operations) may be substantially reduced, with traditional solutions requiring hundreds of MAC operations per output sample, while methods and systems described herein can reduce the total number of MAC operations per output sample by more than an order of magnitude in some cases. For example, the larger number of tap coefficients to be stored and used, the greater the reduction in MAC operations. It is also possible to save substantial amounts of space, as no or virtually no ROM is required, and little to no RAM may be required as well, depending on the requirements of the system making use of the ASRC techniques and apparatus described herein. For example, some RAM may be required to handle jitter. Furthermore, filters implementing the techniques described above may be optimized for performance or other purposes. For example, the decimator used in the process above to reduce the number of elements in the output signal before it is provided to the RMD (e.g., RMD 106) may be substantially optimized for performance or other desirable purposes because the topology of the decimator may be fixed rather than dependent on input and output signals or requiring a large number of tap coefficients.

Various controllers, such as one or more processors, microcontrollers, ASICs, FPGAs, and other circuits, may execute various operations discussed above. Using data stored in associated memory and/or storage, the controller also executes one or more instructions stored on one or more non-transitory computer-readable media, which the controller may include and/or be coupled to, that may result in manipulated data. In some examples, the controller may include one or more processors or other types of controllers. In one example, the controller is or includes at least one processor. In another example, the controller performs at least a portion of the operations discussed above using an application-specific integrated circuit tailored to perform particular operations in addition to, or in lieu of, a general-purpose processor. As illustrated by these examples, examples in accordance with the present disclosure may perform the operations described herein using many specific combinations of hardware and software and the disclosure is not limited to any particular combination of hardware and software components. Examples of the disclosure may include a computer-program product configured to execute methods, processes, and/or operations discussed above. The computer-program product may be, or include, one or more controllers and/or processors configured to execute instructions to perform methods, processes, and/or operations discussed above.

Having thus described several aspects of at least one embodiment, it is to be appreciated various alterations, modifications, and improvements will readily occur to those skilled in the art. Such alterations, modifications, and improvements are intended to be part of, and within the spirit and scope of, this disclosure. Accordingly, the foregoing description and drawings are by way of example only.

What is claimed is:

1. An asynchronous sample rate converter (ASRC) comprising:
   a signal input configured to receive an input signal having one or more input signal values at a first sample rate;
   a first clock input configured to receive an input clock signal corresponding to the first sample rate;

a signal output configured to provide an output signal having one or more output signal values at a second sample rate;

a second clock input configured to receive an output clock signal corresponding to the second sample rate;

a zero-padding circuit configured to add a plurality of zero values following at least one of the one or more input signal values; and a transposed polynomial filter configured to generate the output signal, the output signal having one or more output signal values based on the input signal, the transposed polynomial filter being a transposed farrow filter.

2. The ASRC of claim 1 wherein at least one of the first sample rate and second sample rate are variable rather than constant.

3. The ASRC of claim 1 wherein the transposed polynomial filter has a polynomial order.

4. The ASRC of claim 3 wherein the output signal values of the output signal are based on the polynomial order of the transposed polynomial filter.

5. The ASRC of claim 3 wherein the output signal includes a number of non-zero output signal values, the number of non-zero output signal values being based on the number of non-zero input signal values and the polynomial order of the transposed polynomial filter.

6. The ASRC of claim 1 further comprising a decimating filter, the decimating filter being configured to receive the output signal and preserve one or more of the output signal values based on the second sample frequency, removing any output signal values not preserved.

7. The ASRC of claim 1 wherein the transposed polynomial filter includes at least two of the elements of a set comprising adders, zero-order holds, and multipliers.

8. The ASRC of claim 1 wherein the zero-padding circuit is configured to virtually add the plurality of zeroes to the input signal, such that the input signal is not actually altered.

9. The ASRC of claim 1 having a first mode corresponding to the first sample frequency being greater than the second sample frequency, and a second mode corresponding to the second sample frequency being greater than the first sample frequency, wherein in the first mode the zero-padding circuit is configured to add the plurality of zero values following at least one of the one or more input signal values, and in the second mode the zero-padding circuit is configured to not add the plurality of zero values, and the transposed polynomial filter is configured to interpolate the output signal.

10. The ASRC of claim 1 wherein the transposed polynomial filter includes a first section and a second section, the first section being an integrator and the second section being configured to operate as a transposed polynomial filter and a polynomial filter.

11. A method to convert an input signal from a first sample rate to a second sample rate, the method comprising:

receiving the input signal at the first sample rate, the input signal having one or more input signal values;

receiving a second sample rate;

adding a plurality of zero values following each input signal value of the one or more input signal values;

producing a zero-padded signal based on the input signal by converting each non-zero input signal value of the one or more input signal values to a plurality of non-zero input signal values and replacing one or more of input signal values and the plurality of zero values added following the one or more input signal values with one or more of the plurality of non-zero input signal values;

providing the zero-padded signal to a transposed polynomial filter configured to alter the zero-padded signal to produce an altered input signal having each non-zero element of the zero-padded signal transformed into a respective number of non-zero elements of the altered input signal, the respective number of non-zero elements of the altered input signal being equal to an order of the transposed polynomial filter; and producing an output signal by selecting at least one of one or more signal values of the altered input signal, the selection of the at least one of the one or more signal values of the altered input signal being based on the second sample rate.

12. The method of claim 11 wherein the plurality of non-zero input signal values has a number of elements based on a polynomial order of the transposed polynomial filter.

13. The method of claim 11 wherein at least one of the first sample rate and second sample rate is variable rather than constant.

14. The method of claim 11 wherein adding the plurality of zero values is a virtual operation, such that the input signal is not altered before the zero-padded signal is produced.

15. The method of claim 11 wherein producing the output signal is done by providing the output signal to a fixed decimator.

16. A method to convert a signal between asynchronous sample rates, the method comprising:

receiving an input signal at a first frequency;

receiving a sample frequency;

providing the input signal to a zero padding circuit configured to pad the input signal with zeroes to form a zero padded input signal;

providing the zero padded input signal to a transposed polynomial filter configured to alter the zero padded input signal to produce an altered input signal having each non-zero element of the zero padded input signal transformed into a respective number of non-zero elements of the altered input signal, the respective number of non-zero elements of the altered input signal being equal to the order of the transposed polynomial filter;

providing the altered input signal to a decimator configured to decimate the altered input signal to produce a decimated altered input signal;

sampling the decimated altered input signal at the sample frequency; and providing samples of the decimated altered input signal to an output.

17. The method of claim 16 wherein providing the input signal to the zero padding circuit to pad the input signal with zeroes to form a zero padded input signal is a virtual operation that does not alter the input signal.

18. The method of claim 16 wherein the first frequency and sample frequency are variable with respect to time.

19. The method of claim 16 wherein:

providing the input signal to the zero padding circuit includes sampling the input signal at a sample rate greater than or equal to the first frequency; and providing samples of the decimated altered input signal to an output includes a receiver circuit sampling the decimated altered input signal at a sample rate greater than or equal to a frequency of the decimated altered input signal.

* * * * *